(12) United States Patent
Tanaka et al.

(10) Patent No.: US 11,335,770 B2
(45) Date of Patent: May 17, 2022

(54) SEMICONDUCTOR ISOLATION STRUCTURES HAVING DIFFERENT CONFIGURATIONS IN DIFFERENT DEVICE REGIONS AND METHOD OF FORMING THE SAME

(71) Applicant: Winbond Electronics Corp., Taichung (TW)

(72) Inventors: Yoshinori Tanaka, Kanagawa (JP); Wei-Che Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 9 days.

(21) Appl. No.: 16/885,286

(22) Filed: May 28, 2020

(65) Prior Publication Data

US 2021/0376074 A1 Dec. 2, 2021

(51) Int. Cl.
*H01L 29/06* (2006.01)
*H01L 21/762* (2006.01)
(Continued)

(52) U.S. Cl.
CPC .... *H01L 29/0653* (2013.01); *H01L 21/76224* (2013.01); *H01L 27/092* (2013.01)

(58) Field of Classification Search
CPC ......... H01L 21/76224; H01L 21/76227; H01L 21/76229; H01L 21/76232;
(Continued)

(56) References Cited

U.S. PATENT DOCUMENTS 6,670,689 B2* 12/2003 Oh .................... H01L 21/76229
257/506
6,953,734 B2* 10/2005 Lim .................. H01L 21/76224
257/E21.546
(Continued)

FOREIGN PATENT DOCUMENTS

EP 1487011 2/2010
KR 20070058116 6/2007
(Continued)

OTHER PUBLICATIONS

"Office Action of Taiwan Counterpart Application", dated Nov. 17, 2020, p. 1-p. 8.

*Primary Examiner* — Sonya McCall-Shepard
(74) *Attorney, Agent, or Firm* — JCIPRNET

(57) ABSTRACT

Provided is a semiconductor isolation structure including: a substrate having a first trench in a first region of the substrate and a second trench in a second region of the substrate; a filling layer is located in the first trench and the second trench; a liner layer on the sidewalls and bottom of the first trench and the second trench; a fixed negative charge layer is located between the filling layer and the liner layer in the first trench and the second trench; and a fixed positive charge layer located between the fixed negative charge layer and the liner layer in the first trench. The liner layer, the fixed positive charge layer, the fixed negative charge layer and the filling layer in the first trench form a first isolation structure. The liner layer, the fixed negative charge layer and the filling layer in the second trench form a second isolation structure.

12 Claims, 4 Drawing Sheets

(51) Int. Cl.
*H01L 27/092* (2006.01)
*H01L 27/108* (2006.01)

(58) Field of Classification Search
CPC ..... H01L 21/823481; H01L 21/823878; H01L 29/42324–42336; H01L 29/788–7889; H01L 27/11526–11548; H01L 27/10873–10879; H01L 27/10894–10897; H01L 21/02255; H01L 21/0223; H01L 21/02233; H01L 21/02269–02277; H01L 21/0228; H01L 21/02247; H01L 21/02252; H01L 21/0226; H01L 21/02263; H01L 21/02274; H01L 21/02282; H01L 21/02107–02112; H01L 21/02225; H01L 21/02227; H01L 27/10897; H01L 27/11568; H01L 21/02164; H01L 29/0649; H01L 21/0217; H01L 2027/11829–11833; H01L 2027/1189–11892
See application file for complete search history.

(56) References Cited

U.S. PATENT DOCUMENTS

| | | |
|---|---|---|
| 2002/0070420 A1 | 6/2002 | Oh et al. |
| 2009/0311846 A1 | 12/2009 | Shin et al. |
| 2014/0008652 A1 | 1/2014 | Hsu et al. |
| 2014/0227856 A1 | 8/2014 | Park et al. |
| 2018/0269113 A1 | 9/2018 | Yang et al. |
| 2018/0366323 A1* | 12/2018 | Huang .............. H01L 21/02323 |

FOREIGN PATENT DOCUMENTS

| | | |
|---|---|---|
| TW | 201839990 | 11/2018 |
| TW | 201903857 | 1/2019 |
| TW | 202006928 | 2/2020 |

* cited by examiner

SEMICONDUCTOR ISOLATION STRUCTURES HAVING DIFFERENT CONFIGURATIONS IN DIFFERENT DEVICE REGIONS AND METHOD OF FORMING THE SAME

BACKGROUND

Technical Field

The embodiments of the present invention relate to an integrated circuit and a method for forming the same, and particularly to a semiconductor isolation structure and a method for forming the same.

Description of Related Art

In the semiconductor manufacturing process, isolation structures are usually used to separate semiconductor devices in a substrate to prevent carriers from moving between adjacent devices through the substrate. For example, the isolation structure is formed between dense semiconductor circuits such as adjacent field effect transistors (FETs) in a dynamic random access memory (DRAM) to reduce the leakage current of field effect transistors. However, the current isolation structure cannot satisfy both the leakage current requirement of the P-type metal oxide semiconductor (PMOS) device when it is turned off and the hump effect of the N-type metal oxide semiconductor (NMOS) device.

SUMMARY

The embodiments of the invention provide a semiconductor isolation structure and a method for forming the same, which may reduce the leakage current of the PMOS device and avoid the hump effect of the NMOS device.

The embodiments of the present invention provide a semiconductor isolation structure, including: a substrate having a first trench in a first region of the substrate and a second trench in a second region of the substrate; a filling layer in the first trench and the second trench; a liner layer on sidewalls and bottoms of the first trench and the second trench; a fixed negative charge layer is located between the filling layer and the liner layer in the first trench and the second trench; and a fixed positive charge layer located between the fixed negative charge layer and the liner layer in the first trench. The liner layer, the fixed positive charge layer, the fixed negative charge layer and the filling layer in the first trench form a first isolation structure. The liner layer, the fixed negative charge layer and the filling layer in the second trench form a second isolation structure.

The embodiments of the invention provide a method for forming a semiconductor isolation structure, including: forming a first trench in a P-type metal oxide semiconductor region of a substrate, and forming a second trench in an N-type metal oxide semiconductor region of the substrate n; forming a liner layer to cover sidewalls and bottoms of the first trench and the second trench; forming a fixed positive charge layer to cover the liner layer in the first trench; forming a fixed negative charge layer to cover the fixed positive charge layer in the first trench, and the liner layer in the second trench; and forming a filling layer in the first trench and the second trench to cover the fixed negative charge layer.

Based on the above, the semiconductor isolation structure and the method of the same according to the embodiment of the present invention, the fixed negative charge layer of the isolation structure of the PMOS region is far away from the sidewalls of the trench thereof, and a fixed positive charge layer near the sidewalls of the trench thereof. The isolation structure of the NMOS region does not have a fixed positive charge layer and the fixed negative charge layer near the trench sidewall thereof. Therefore, the leakage current of the PMOS device in the off state can be reduced or suppressed, and the hump effect of NMOS devices may be avoided.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
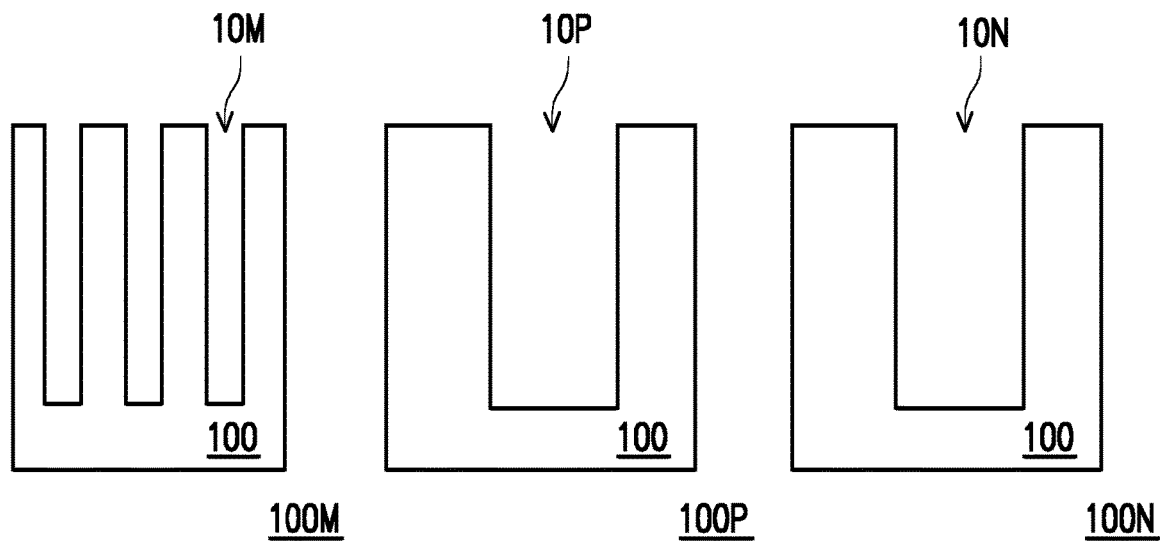
FIGS. 1A to 1F are schematic cross-sectional views of a method for forming a semiconductor isolation structure according to an embodiment of the present invention.

FIG. 1A, trenches 10M, 10P, and 10N are formed in regions 100M, 100P, and 100N of a substrate 100, respectively. The substrate 100 may be a semiconductor substrate, for example, a silicon substrate. The region 100M may be a memory cell region, for example, a memory cell region of DRAM. The region 100P may be a PMOS region in a peripheral circuit region. The region 100N may be an NMOS region in the peripheral circuit region. In an embodiment, the regions 100M, 100P, and 100N are cross-sectional views of a A-A' line, a B-B' line, and a C-C' line of a memory cell region of a semiconductor device shown in FIG. 2, respectively. Trenches 10M, 10P, and 10N may be formed through lithography and etching processes. In an embodiment, a width of the trench 10M is smaller than a width of the trench 10P and/or a width of the trench 10N.

Figure 1B:
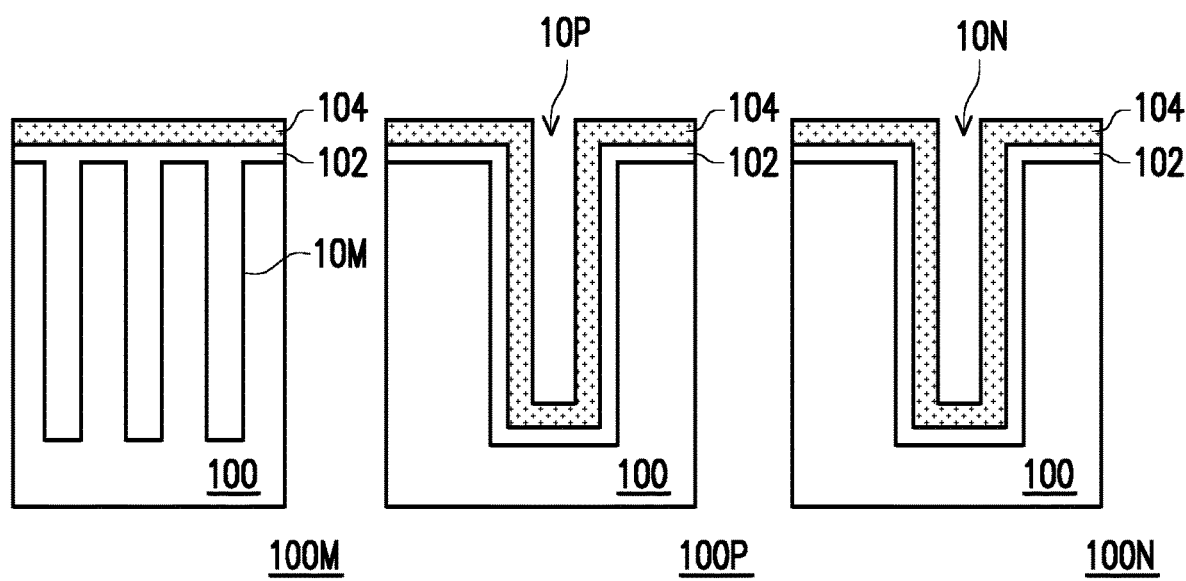

Referring to FIG. 1B, a liner layer 102 is formed on the substrate 100 and sidewalls and bottoms of the trenches 10M, 10P, and 10N. The liner layer 102 is, for example, a conformal silicon oxide layer formed by a thermal oxidation method. Next, a fixed positive charge layer 104 is formed on the liner layer 10. In an embodiment, the densification of the liner layer 102 is greater than that of the fixed positive charge layer 104. The fixed positive charge layer 104 is, for example, a fixed positive charge silicon oxide layer or other oxide layer formed by a thermal oxidation method or a chemical vapor deposition method. The trench 10M is occupied by the liner layer 102, so that the fixed positive charge layer 104 is not filled into the trench 10M. The trenches 10P and 10N are not completely occupied by the liner layer 102, so that the fixed positive charge layer 104 may be filled into the trenches 10P and 10N.

Figure 1C:
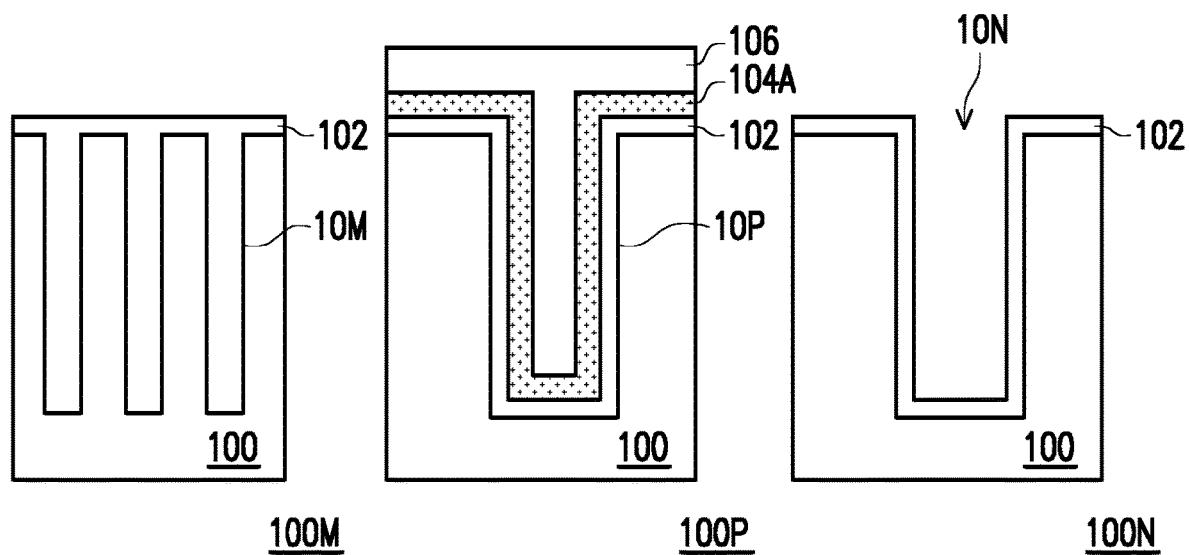

FIG. 1C, a mask layer (for example, a patterned photoresist layer) 106 is formed on the substrate 100 to cover the fixed positive charge layer 104 in the region 100P. Next, using the mask layer 106 as a mask, an etching process is performed to remove the fixed positive charge material layer 104 in the regions 100M and 100N, leaving a fixed positive charge material layer 104A in the region 100P. The etching process is, for example, a dry etching process. The etchant used in the etching process has a high etching selectivity between the fixed positive charge layer 104 and the liner layer 102, such as hydrogen fluoride (HF) vapor.

Figure 1D:
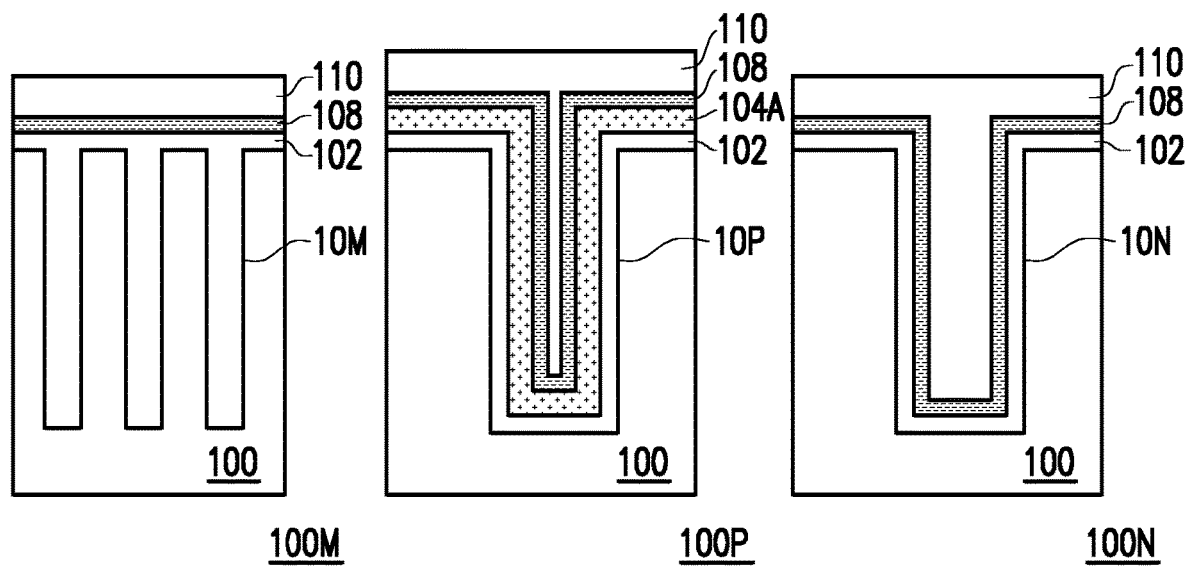

Referring to FIG. 1D, the mask layer 106 is removed. Next, a fixed negative charge layer 108 is formed on the substrate 100 to cover the liner layer 102 in the regions 100M and 100N and the fixed positive charge material layer 104A in the region 100P. In an embodiment, the fixed negative charge layer 108 in the region 100M is not filled in the trench 10M, and the fixed negative charge layer 108 in the regions 100P and 100N is filled into trenches 10P and 10N. The fixed negative charge layer 108 is, for example, a fixed negative charge silicon nitride layer or other nitride layer. The other nitride layer may be a nitrogen-rich silicon nitride layer. The fixed negative charge layer 108 may be formed using a chemical vapor deposition (CVD) process or a physical vapor deposition process. The CVD process may be PECVD such as ICPECVD, LPCVD, or ALD using plasma as appropriate. In some embodiments, the fixed negative charge layer 108 is a plasma nitride material. If a non-plasma deposition technique is used to deposit a film and a post-treatment process (such as plasma-containing nitrogen ions) is performed during or after the deposition process, plasma nitridation will occur. The nitrogen-rich film formed by plasma nitridation may accumulate negative charges. In some embodiments, thermal treatment or plasma treatment with ammonia is beneficial for increasing negative charge.

After that, a filling layer 110 is formed on the fixed negative charge layer 108. In an embodiment, the filling layer 110 in the region 100M covers the fixed negative charge layer 108 without filling in the trench 10M. The filling layer 110 in the regions 100P and 100N is filled into the trenches 10P and 10N. The filling layer 110 may be, for example, spin coating glass (SOG) formed by spin coating process, and then an anneal process is performed at 600 degrees Celsius to 800 degrees Celsius.

Figure 1E:
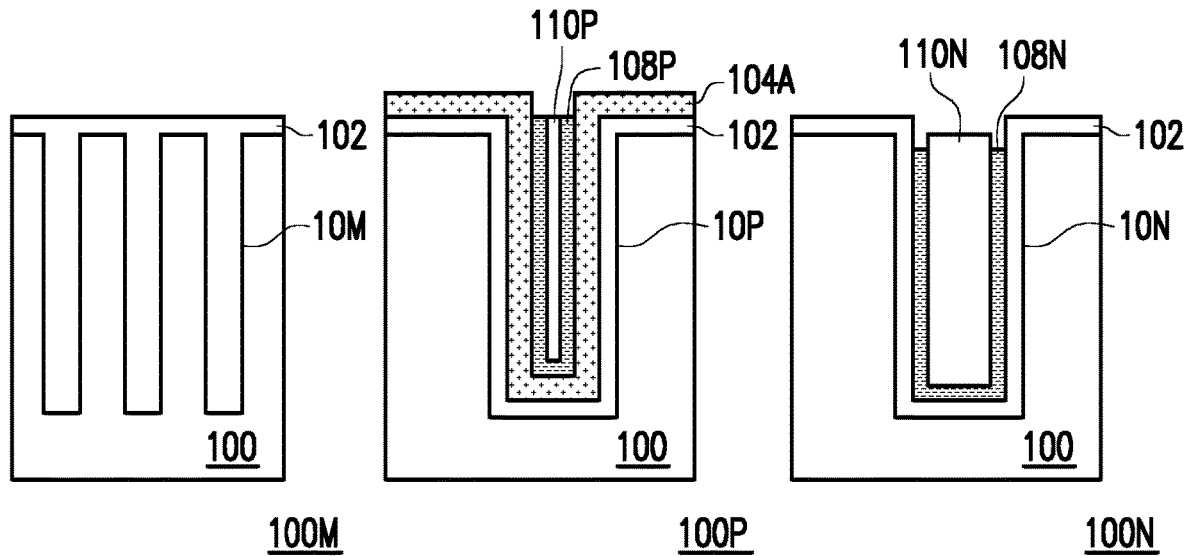

Referring to FIG. 1E, a planarization process is performed to remove a portion of the filling layer 110 on the fixed negative charge layer 108, thereby leaving filling layers 110P and 110N in the trenches 10P and 10N, respectively. The planarization process may be, for example, a chemical mechanical polishing process (CMP) by using the fixed negative charge layer 108 as a polishing stop layer. Afterwards, an etching process is performed to remove a portion of the fixed negative charge layer 108, thereby leaving fixed negative charge layers 108P and 108N in the trenches 10P and 10N, respectively. The etching process is, for example, a wet etching process by using an etchant such as hot phosphoric acid.

Figure 1F:
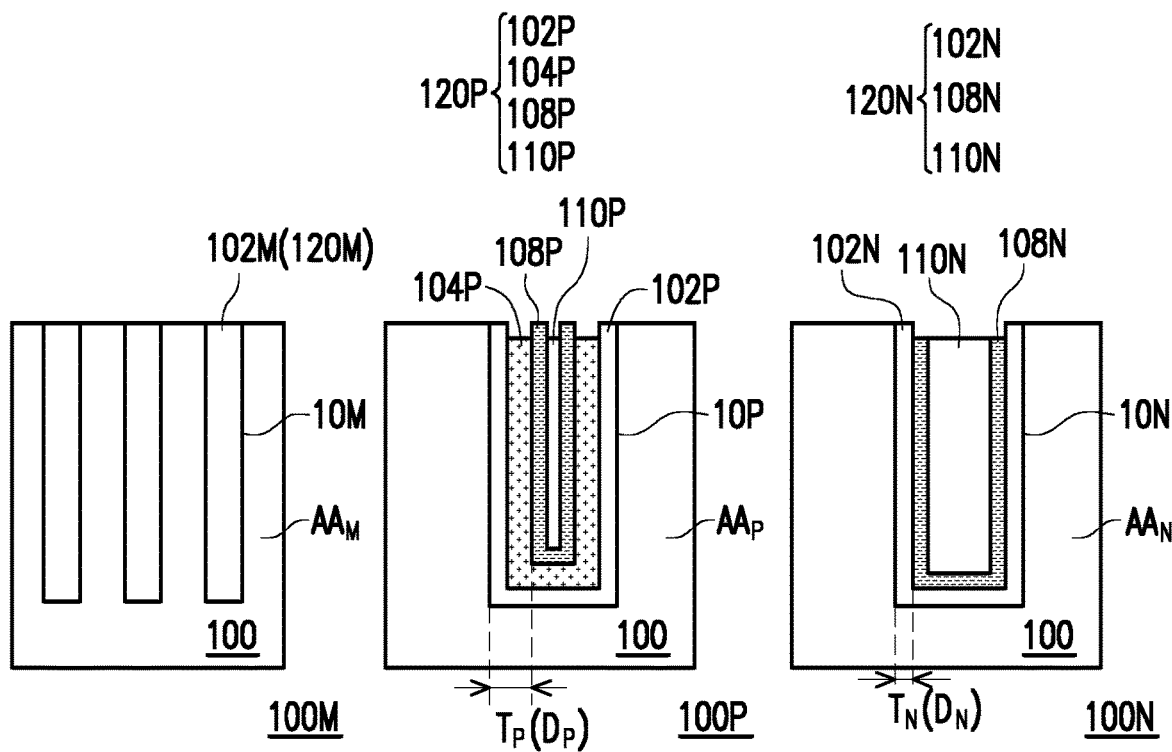

Referring to FIG. 1F, an etching process is performed to remove the fixed positive charge material layer 104A and the liner layer 102 on a surface of the substrate 100, thereby leaving a liner layer 102M in the trench 10M, a fixed positive charge layer 104P and a liner layer 102P in the trench 10P, and a liner layer 102N in the trench 10N. The etching process may be a wet etching process or a dry etching process. The wet etching process may use an etchant containing fluorine, such as hydrofluoric acid. The dry etching process may use an etchant containing fluorine, such as hydrogen fluoride vapor.

Figure 2:
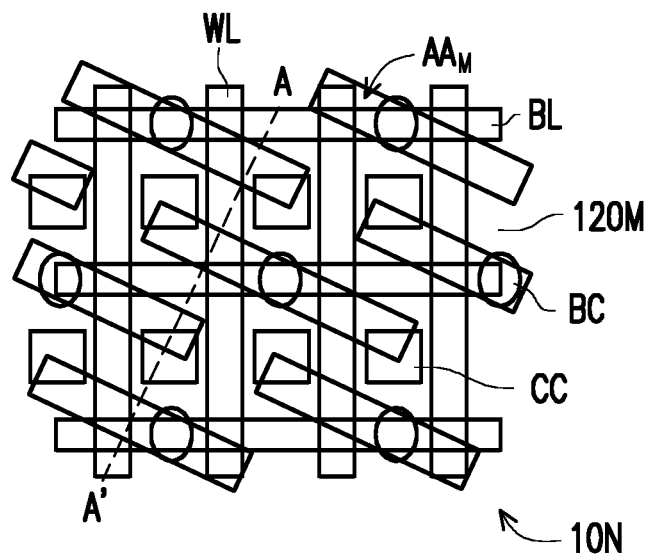
FIG. 2 is a top view of a semiconductor device according to an embodiment of the present invention.
Figure 2:
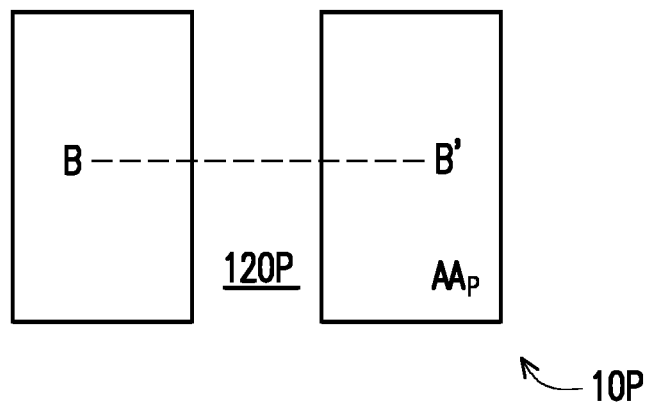
Figure 2:
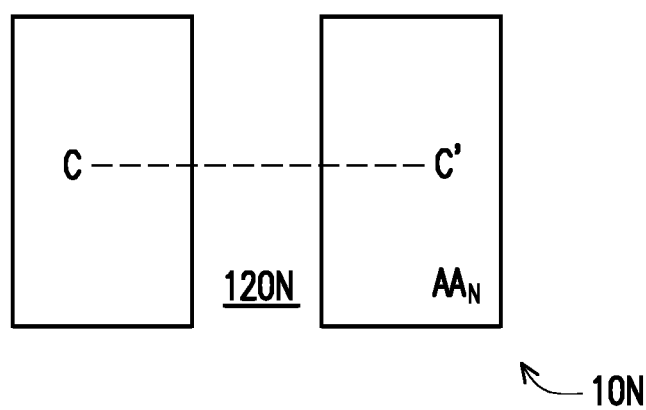

Referring to FIGS. 1F and 2, with the above process, isolation structures 120M, 120P, and 120N are formed in the regions 100M, 100P, and 100N, respectively. The isolation structures 120M, 120P, and 120N may also be referred to as shallow trench isolation structures 120M, 120P, and 120N, respectively. The isolation structures 120M, 120P, and 120N define active regions $AA_M$, $AA_P$, and $AA_N$ in the regions 100M, 100P, and 100N of the substrate 100, respectively. Various components may be formed before or after the formation of isolation structures 120M, 120P, and 120N. For example, word lines WLs, bit lines BLs, bit line contacts BCs, and capacitors CCs of the memory are formed in the region 100M, and a PMOS device (not shown) and a NMOS device (not shown) are formed in the regions 100P and 10N, respectively, but not limited thereto.

Referring to FIG. 1F, the semiconductor isolation structure of the embodiment of the present invention includes isolation structures 120M, 120P, and 120N. The isolation structures 120M, 120P, and 120N have different numbers of layers. The isolation structure 120P has the most layers, the isolation structure 120M has the least layers, and the isolation structure 120N has the layers between the isolation structure 120M and the isolation structure 120N. In an embodiment, the isolation structure 120M includes one layer; the isolation structure 120P includes four layers; the isolation structure 120N includes three layers. The isolation structure 120P includes the fixed positive charge layer 104P close to the trench 10P, and the isolation structure 120N includes the fixed negative charge layer 108N close to the trench 10P. The fixed positive charge layer 104P is, for example, a fixed positive charge silicon oxide layer. The fixed negative charge layer 108N is, for example, a fixed negative charge silicon nitride layer.

More specifically, the isolation structure 120P includes the liner layer 102P, the fixed positive charge layer 104P, the fixed negative charge layer 108P, and the filling layer 110P. In an embodiment, a top surface of the fixed positive charge layer 104P is lower than a top surface of the fixed negative charge layer 108P and a top surface of the liner layer 102P. The filling layer 110P is located in the trench 10P, and the liner layer 102P covers the sidewall and the bottom of the trench 10P. The fixed negative charge layer 108P is located between the filling layer 110P and the liner layer 102P. The fixed positive charge layer 104P is located between the fixed negative charge layer 108P and the liner layer 102P.

The isolation structure 120N includes the liner layer 102N, the fixed negative charge layer 108N, and the filling layer 110N. The filling layer 110N is located in the trench 10N, and the liner layer 102N covers the sidewall and the bottom of the trench 10N. The isolation structure 120N is free of a fixed positive charge layer. Therefore, the fixed negative charge layer 108N is located between the filling layer 110N and the liner layer 102N, and is physically connected to the filling layer 110N and the liner layer 102N.

The isolation structure 120M includes the liner layer 102M. The trench 10M is occupied by the liner layer 102M. The isolation structure 120M is free of a fixed positive charge layer, a fixed negative charge layer and a filling layer.

In some embodiments, the fixed negative charge layers 108P and 108N are fixed negative charge silicon nitride layers, the fixed positive charge layer 104P is a fixed positive charge silicon oxide layer, and the liner layers 102P and 102N are silicon oxide layers, therefore, the silicon oxide layer (including the liner layer) between the fixed negative charge layer 108P and the sidewall of the adjacent trench 10P (including the liner layer 102P and the fixed positive charge layer 104P) have a thickness $T_P$ greater than a thickness $T_N$ of the silicon oxide layer (ie, the liner layer 102N) between the fixed negative charge layer 108N and the sidewall of the adjacent trench 10N.

The isolation structure 120P contains the fixed positive charge layer 104P, while the isolation structure 120N is free of a fixed positive charge layer. Therefore, a distance $D_P$ between the fixed negative charge layer 108P of the isolation structure 120P and the sidewall of the adjacent trench 10P is greater than a distance $D_N$ between the fixed negative charge layer 108N of the isolation structure 120N and the sidewall of the adjacent trench 10N. The fixed negative charge layer (silicon nitride layer) 108P of the isolation structure 120P is far away from the sidewalls of the trench 101), which is beneficial to reduce or suppress the leakage current caused by the fixed negative charge layer 108 when the PMOS device is in the off state. On the other hand, the isolation structure 120N is free of a fixed positive charge layer, so the hump effect of the NMOS device caused by the positive charge can be avoided.

In this embodiment, the isolation structure 120P is located in the PMOS region, and the fixed positive charge layer 104P of the isolation structure 120P is closer to the sidewall of the trench 10P than the fixed negative charge layer 108P. Therefore, it is beneficial to reduce or suppress the leakage current when the PMOS device is turned off. The isolation structure 120N is located in the NMOS region, and the fixed negative charge layer 108N of the isolation structure 120P is close to the sidewall of the trench 10N. Therefore, it is beneficial to reduce or suppress the leakage current when the NMOS device is turned off.

In summary, the semiconductor isolation structure and the method of forming the embodiments of the present invention can reduce the leakage current of the PMOS device, and the hump effect of the NMOS device caused from the positive charge can be prevented. Therefore, the embodiments of the present invention can be applied to complementary metal oxide semiconductor (CMOS) devices to improve the reliability of the devices, and can be compatible with the memory process.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor isolation structure, comprising:
   a substrate having a first trench in a first region of the substrate and a second trench in a second region of the substrate;
   a filling layer in the first trench and the second trench;
   a liner layer on sidewalls and bottoms of the first trench and the second trench;
   a fixed negative charge layer between the filling layer and the liner layer in the first trench and the second trench; and
   a fixed positive charge layer located between the fixed negative charge layer and the liner layer in the first trench,
   wherein the liner layer, the fixed positive charge layer, the fixed negative charge layer and the filling layer in the first trench form a first isolation structure; and
   the liner layer, the fixed negative charge layer and the filling layer in the second trench form a second isolation structure,
   wherein a top surface of the fixed negative charge layer in the first trench is higher than a top surface of the fixed positive charge layer,
   wherein the top surface of the fixed negative charge layer in the first trench is higher than a top surface of the fixed negative charge layer in the second trench.

2. The semiconductor isolation structure of claim 1, wherein the first region comprises a P-type metal oxide semiconductor region, and the second region comprises an N-type metal oxide semiconductor region.

3. The semiconductor isolation structure of claim 2, wherein the liner layer comprises a silicon oxide layer, the fixed negative charge layer includes a fixed negative charge silicon nitride layer, and the fixed positive charge layer includes a fixed positive charge silicon oxide layer.

4. The semiconductor isolation structure of claim 1, wherein the second trench is free of the fixed positive charge layer therein.

5. The semiconductor isolation structure of claim 2, wherein the first region and the second region are peripheral circuit regions, and the substrate further includes a third isolation structure located in a memory cell region of the substrate, the third isolation stricture comprises the liner layer and free of the fixed positive charge layer, the fixed negative charge layer and the filling layer therein.

6. The semiconductor isolation structure of claim 1, wherein a distance between the fixed negative charge layer in the first trench and a sidewall of the first trench is greater than a distance between the fixed negative charge layer in the second trench and a sidewall of the second trench.

7. The semiconductor isolation structure of claim 1, wherein in the first trench, the top surface of the fixed positive charge layer is lower than a top surface of the liner layer.

8. A method for forming a semiconductor isolation structure comprising:
   forming a first trench in a P-type metal oxide semiconductor region of a substrate, and forming a second trench in an N-type metal oxide semiconductor region of the substrate;
   forming a liner layer to cover sidewalls and bottoms of the first trench and the second trench;
   forming a fixed positive charge layer to cover the liner layer in the first trench;
   forming a fixed negative charge layer to cover the fixed positive charge layer in the first trench and the liner layer in the second trench; and
   forming a filling layer in the first trench and the second trench to cover the fixed negative charge layer,
   wherein the fixed negative charge layer is located between the filling layer and the liner layer in the first trench and the second trench, and the fixed positive charge layer is located between the fixed negative charge layer and the liner layer in the first trench;
   wherein the liner layer, the fixed positive charge layer, the fixed negative charge layer and the filling layer in the first trench form a first isolation structure; and the liner layer, the fixed negative charge layer and the filling layer in the second trench form a second isolation structure; and
   wherein a top surface of the fixed negative charge layer in the first trench is higher than a top surface of the fixed positive charge layer,
   wherein the top surface of the fixed negative charge layer in the first trench is higher than a top surface of the fixed negative charge layer in the second trench.

9. The method of claim 8, wherein the forming the fixed positive charged layer comprises forming a fixed positive charged silicon oxide layer by a thermal oxidation method or a chemical vapor deposition method, and the forming the fixed negative charge layer comprises forming a fixed negative charge silicon nitride layer by chemical vapor deposition, and the forming the liner layer comprises a thermal oxidation method.

10. The method of claim 8 further comprising:
forming a third trench in the memory cell region of the substrate; and
forming the liner layer in the third trench.

11. The method of claim 8, wherein the method for forming the fixed positive charge layer includes:
forming a fixed positive charge material layer in the P-type metal oxide semiconductor region and the N-type metal oxide semiconductor region;
forming a mask layer to cover the fixed positive charge material layer in the P-type metal oxide semiconductor region;
removing the fixed positive charge layer not covered by the mask layer;
removing the mask layer; and
removing the fixed positive charge material layer except the first trench.

12. The semiconductor isolation structure of claim 1, wherein the top surface of the fixed positive charge layer is level with the top surface of the fixed negative charge layer in the second trench.

\* \* \* \* \*